(12) United States Patent
Chen (10) Patent No.: US 10,658,402 B2
(45) Date of Patent: May 19, 2020

(54) MANUFACTURING METHODS FOR LOW TEMPERATURE POLY-SILICON ARRAY SUBSTRATE AND LOW TEMPERATURE POLY-SILICON THIN-FILM TRANSISTOR

(71) Applicant: Wuhan China Star Optoelectronics Technology Co., Ltd., Wuhan (CN)

(72) Inventor: Chen Chen, Shenzhen (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 310 days.

(21) Appl. No.: 15/737,131

(22) PCT Filed: Sep. 21, 2017

(86) PCT No.: PCT/CN2017/102658
§ 371 (c)(1),
(2) Date: Dec. 15, 2017

(87) PCT Pub. No.: WO2019/024195
PCT Pub. Date: Feb. 7, 2019

(65) Prior Publication Data
US 2019/0386031 A1  Dec. 19, 2019

(30) Foreign Application Priority Data

Aug. 2, 2017  (CN) .......................... 2017 1 0655302

(51) Int. Cl.
*H01L 27/12* (2006.01)
*H01L 21/77* (2017.01)
(Continued)

(52) U.S. Cl.
CPC ........ *H01L 27/127* (2013.01); *H01L 27/1222* (2013.01); *H01L 29/66492* (2013.01);
(Continued)

(58) Field of Classification Search
CPC ............ H01L 27/127; H01L 29/78696; H01L 29/78675; H01L 29/78633;
(Continued)

(56) References Cited

U.S. PATENT DOCUMENTS 6,700,330 B2   3/2004  Koyama
7,208,766 B2*  4/2007  Yamazaki ......... G02F 1/136213
                                              257/296
(Continued)

FOREIGN PATENT DOCUMENTS

CN    101958250 A    1/2011
CN    103296058 A    9/2013

*Primary Examiner* — Selim U Ahmed
(74) *Attorney, Agent, or Firm* — Brinks Gilson & Lione (57) ABSTRACT

Manufacturing methods for a low temperature poly-silicon array substrate and for a low temperature poly-silicon thin-film transistor are provided. The manufacturing method for the low temperature poly-silicon array substrate includes: providing a substrate; forming a poly-silicon semiconductor pattern on the substrate; a first channel region, a first source region and a first drain region being formed on a first portion of the poly-silicon semiconductor pattern that corresponds to the first thin-film transistor and a second thin-film transistor; forming a gate insulation layer; performing an activation treatment; forming a gate on the gate insulation layer after the activation treatment; forming an interlayer insulation layer between the gate insulation layer and the gate; performing a hydrogen treatment; forming a source/drain pattern on the interlayer insulation layer after the hydrogen treatment, and connecting the source/drain pattern to the source region and the drain region in the poly-silicon semiconductor pattern via a through hole.

18 Claims, 5 Drawing Sheets

(51) Int. Cl.
*H01L 29/66* (2006.01)
*H01L 29/786* (2006.01)

(52) U.S. Cl.
CPC .. *H01L 29/66757* (2013.01); *H01L 29/78621* (2013.01); *H01L 29/78633* (2013.01); *H01L 29/78675* (2013.01); *H01L 29/78696* (2013.01)

(58) Field of Classification Search
CPC ......... H01L 29/78621; H01L 29/66757; H01L 29/66492; H01L 27/1222; H01L 27/1259; H01L 27/12; H01L 21/77
See application file for complete search history.

(56) References Cited

U.S. PATENT DOCUMENTS

| | | | |
|---|---|---|---|
| 7,633,573 B2 | 12/2009 | Kim | |
| 7,642,559 B2 * | 1/2010 | Yamazaki | H01L 27/3244 257/79 |
| 2003/0090002 A1 * | 5/2003 | Sugawara | H01L 21/2885 257/784 |

* cited by examiner

MANUFACTURING METHODS FOR LOW TEMPERATURE POLY-SILICON ARRAY SUBSTRATE AND LOW TEMPERATURE POLY-SILICON THIN-FILM TRANSISTOR

CROSS-REFERENCE TO RELATED APPLICATIONS

The present application is a 35 U.S.C. § 371 National Phase conversion of International (PCT) Patent Application No. PCT/CN2017/102658 filed Sep. 21, 2017, which claims foreign priority of Chinese Patent Application No. 201710655302.6, filed on Aug. 2, 2017 in the State Intellectual Property Office of China, the entire contents of which are hereby incorporated by reference.

TECHNICAL FIELD

Embodiments of the present disclosure generally relate to display technology, and in particular relate to a manufacturing method for a low temperature poly-silicon array substrate and a manufacturing method for a low temperature poly-silicon thin-film transistor.

BACKGROUND

In manufacturing processes of display panels, low temperature poly-silicon (LTPS) technology gradually occupies the market of display screens in small and medium size, since the LTPS technology has advantages of high mobility, low cost or the like.

At present, in a manufacturing method using the LTPS technology, a hydrogen treatment and an activation treatment need to be performed. In this way, products manufactured by the LTPS technology can only be made from metal materials having high melting temperatures such as molybdenum or the like. However, generally, the metal materials having high melting temperatures such as molybdenum may have high resistances.

In long-term research and development, the applicant of the present disclosure finds out that, in the manufacturing method using the LTPS technology, during the hydrogen treatment and activation treatment processes, the temperature is larger than or equal to 500 degrees centigrade, and thus only the metal materials having high melting temperatures can be used in LTPS technology. In this way, it is impossible to meet the needs of large-sized display screens, and thus the LTPS technology cannot be applied to the manufacturing processes of the large-sized display screens.

SUMMARY

Aiming at defects in the prior art described above, the objective of the present disclosure is to provide a manufacturing method for a low temperature poly-silicon array substrate and a manufacturing method for a low temperature poly-silicon thin-film transistor, which may apply the metal materials having lower melting temperatures to the LTPS technology, in such a way that the LTPS technology may be applied to the manufacturing of large-sized screens, and the large-sized screens may possess the advantages of high mobility and low cost.

To solve the technical problems above, in one aspect, a technical solution is adopted in the present application: a manufacturing method for a low temperature poly-silicon array substrate is provided. The low temperature poly-silicon array substrate comprises a pixel region and a driving region; the pixel region comprises a plurality of pixels arranged in an array, and each of the plurality of pixels comprises a corresponding first thin-film transistor and a corresponding pixel electrode; the driving region comprises a driving circuit having a CMOS circuit; the CMOS circuit comprises a second thin-film transistor and a third thin-film transistor; the manufacturing method comprises:

providing a substrate;

forming a poly-silicon semiconductor pattern on the substrate; a first channel region, a first source region and a first drain region being formed on a first portion of the poly-silicon semiconductor pattern that corresponds to the first thin-film transistor and the second thin-film transistor;

forming a gate insulation layer;

performing an activation treatment; a temperature of the activation treatment being larger than or equal to 500 degrees Centigrade;

forming a gate on the gate insulation layer after the activation treatment;

forming an interlayer insulation layer between the gate insulation layer and the gate;

performing a hydrogen treatment; a temperature of the hydrogen treatment being larger than or equal to 400 degrees Centigrade and meanwhile less than 500 degrees Centigrade, in such a way that the gate is capable of being made from a metal material having a melting temperature less than 500 degrees Centigrade;

forming a source/drain pattern on the interlayer insulation layer after the hydrogen treatment, and connecting the source/drain pattern to the source region and the drain region in the poly-silicon semiconductor pattern via a through hole; the first thin-film transistor and the second thin-film transistor being an n-type thin-film transistor, while the third thin-film transistor being a p-type thin-film transistor.

To solve the technical problems above, in another aspect, a technical solution is adopted in the present application: a manufacturing method for a low temperature poly-silicon array substrate is provided. The low temperature poly-silicon array substrate comprises a pixel region and a driving region; the pixel region comprises a plurality of pixels arranged in an array, and each of the plurality of pixels comprises a corresponding first thin-film transistor and a corresponding pixel electrode; the driving region comprises a driving circuit having a CMOS circuit; the CMOS circuit comprises a second thin-film transistor and a third thin-film transistor; the manufacturing method comprises:

providing a substrate;

forming a poly-silicon semiconductor pattern on the substrate; a first channel region, a first source region and a first drain region being formed on a first portion of the poly-silicon semiconductor pattern that corresponds to the first thin-film transistor and the second thin-film transistor;

forming a gate insulation layer;

performing an activation treatment;

forming a gate on the gate insulation layer after the activation treatment;

forming an interlayer insulation layer between the gate insulation layer and the gate;

performing a hydrogen treatment;

forming a source/drain pattern on the interlayer insulation layer after the hydrogen treatment, and connecting the source/drain pattern to the source region and the drain region in the poly-silicon semiconductor pattern via a through hole.

To solve the technical problems above, in another aspect, a technical solution is adopted in the present application: a manufacturing method for a low temperature poly-silicon thin-film transistor is provided. The manufacturing method comprises:

providing a substrate;

forming a poly-silicon semiconductor layer on the substrate; a channel region, a source region and a drain region being formed on the poly-silicon semiconductor layer;

forming a gate insulation layer;

performing an activation treatment;

forming a gate on the gate insulation layer after the activation treatment;

forming an interlayer insulation layer between the gate insulation layer and the gate;

performing a hydrogen treatment;

forming a source/drain on the interlayer insulation layer after the hydrogen treatment, and connecting the source/drain to the source region and the drain region in the poly-silicon semiconductor layer via a through hole.

The present disclosure may have the following advantages: Different from the prior art, in the manufacturing method for the low temperature poly-silicon array substrate provided in the present embodiment, the low temperature poly-silicon array substrate may include a pixel region and a driving region. In this embodiment, the pixel region may include a plurality of pixels arranged in an array, and each of the plurality of pixels may include a corresponding first thin-film transistor and a corresponding pixel electrode. The driving region may include a driving circuit having a CMOS circuit. The CMOS circuit may include a second thin-film transistor and a third thin-film transistor. In this embodiment, the manufacturing method may include: providing a substrate; forming a poly-silicon semiconductor pattern on the substrate, wherein a first channel region, a first source region and a first drain region may be formed on the first portion of the poly-silicon semiconductor pattern that corresponds to the first thin-film transistor and the second thin-film transistor; forming a gate insulation layer; performing an activation treatment; forming a gate on the gate insulation layer 40 after the activation treatment; forming an interlayer insulation layer between the gate insulation layer and the gate; performing a hydrogen treatment; forming a source/drain pattern on the interlayer insulation layer after the hydrogen treatment, and connecting the source/drain pattern to the source region and the drain region in the poly-silicon semiconductor pattern via a plurality of through holes. In the manufacturing method provided in this embodiment, the gate may be formed on the gate insulation layer after the activation treatment, and then the hydrogen treatment may be performed after the gate is formed. In this way, the activation treatment and the hydrogen treatment are performed separately, and thus the temperature of the hydrogen treatment may be lower than the temperature of the activation treatment, and the activation treatment may be performed before the gate is formed. In the manufacturing method described above, the gate may not only be made from the metal material having a higher melting temperature such as molybdenum or the like, but also from the metal material having a lower melting temperature such as titanium, aluminum, copper, or the like. In this way, the LTPS technology may be applied to the manufacturing method of large-sized screens, and thus it is possible to guarantee the quality of the large-sized screens meanwhile the large-sized screens may possess the advantages of high mobility and low cost.

DETAILED DESCRIPTION

The present disclosure will be described in detail with reference to the drawings and embodiments.

Low temperature poly-silicon array substrate may include a pixel region and a driving region. In this embodiment, the pixel region may include a plurality of pixels arranged in an array, and each of the plurality of pixels may include a corresponding first thin-film transistor and a corresponding pixel electrode. The driving region may include a driving circuit having a CMOS circuit. The CMOS circuit may include a second thin-film transistor and a third thin-film transistor. In this embodiment, the first thin-film transistor and the second thin-film transistor may be implemented as an n-type thin-film transistor, while the third thin-film transistor may be implemented as a p-type thin-film transistor.

Figure 1:
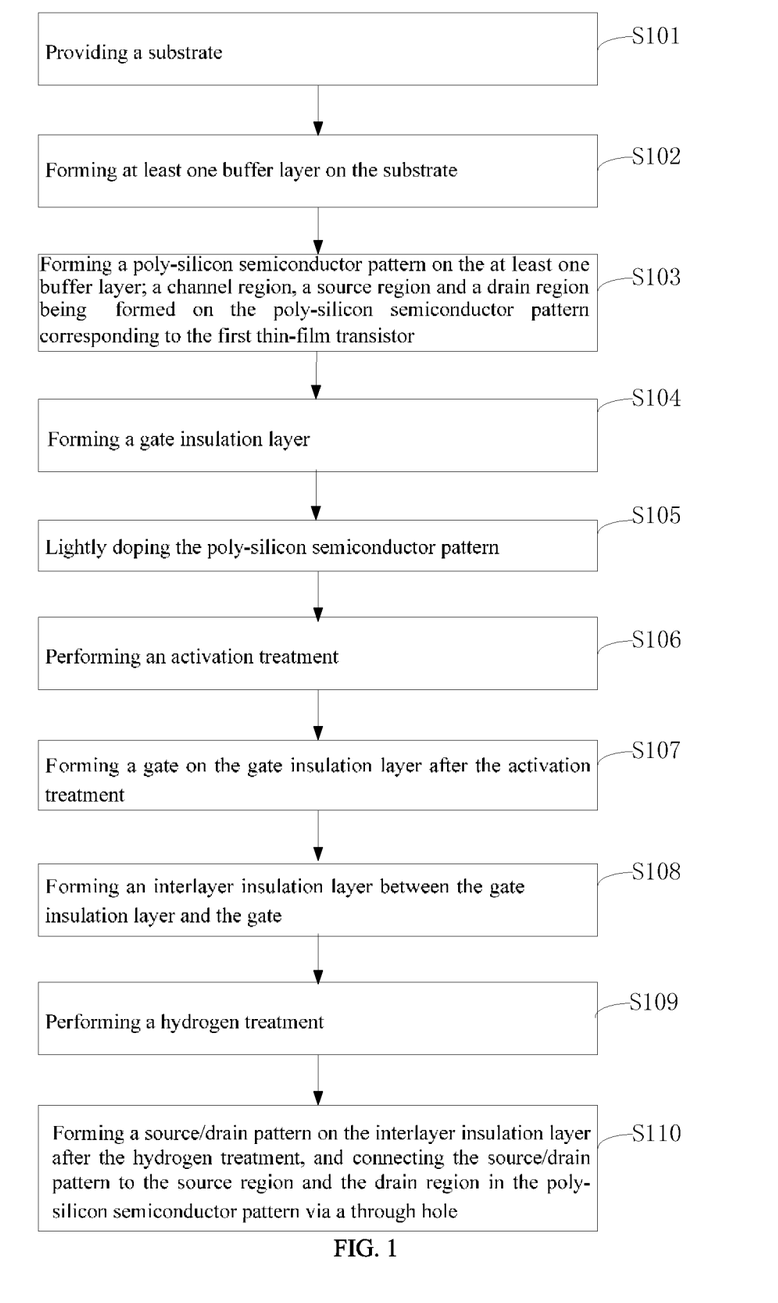
FIG. 1 is flow chart of a manufacturing method for a low temperature poly-silicon array substrate according to one embodiment of the present disclosure.

Referring to FIG. 1, a manufacturing method for a low temperature poly-silicon array substrate is provided in the present disclosure. The manufacturing method may include the following blocks.

At block S101, a substrate 10 may be provided.

In one embodiment, the substrate 10 may be a glass substrate.

Figure 2:
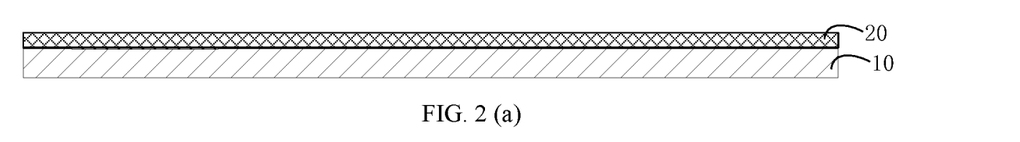
FIG. 2(a)-FIG. 2(g) are structural flow charts of the manufacturing method for the low temperature poly-silicon array substrate according to one embodiment of the present disclosure.

At block S102, referring to FIG. 2(a), at least one buffer layer 20 may be formed on the substrate 10.

In this embodiment, one buffer layer 20 is formed on the substrate 10.

It could be understood that, the at least one buffer layer 20 may effectively prevent metal ions in the glass substrate, such as aluminum ions, barium ions, sodium ions or the like, from diffusing to an active region during subsequent processes. In addition, the at least one buffer layer may further contribute to reducing heat conduction.

Figure 2B:
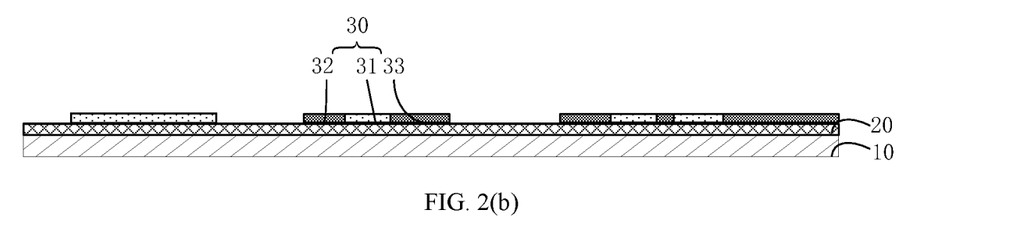

At block S103, referring to FIG. 2(b), a poly-silicon semiconductor pattern 30 may be formed on the buffering layer 20. In this embodiment, a first channel region 31, a first source region 32 and a first drain region 33 may be formed on a first portion of the poly-silicon semiconductor pattern 30 that corresponds to the first thin-film transistor and the second thin-film transistor.

In specific, the block S103 may further include following blocks:

forming the poly-silicon semiconductor pattern 30;

performing a channel doping in the first portion of the poly-silicon semiconductor pattern 30 that corresponds to the first thin-film transistor and the second thin-film transistor; and performing a source/drain region doping the first portion of the poly-silicon semiconductor pattern 30 that corresponds to the first thin-film transistor and the second thin-film transistor, in such a way that the first channel region 31, the first source region 32 and the first drain region 33 may be formed on the first portion of the poly-silicon semiconductor pattern 30 that corresponds to the first thin-film transistor and the second thin-film transistor.

In one embodiment, a light shielding pattern may be formed before the at least one buffer layer 20 is formed. Leakage of electricity may occur when the first portion of the poly-silicon semiconductor pattern 30 that corresponds to the first thin-film transistor and the second thin-film transistor is exposed to ambient lights. By arranging the light shielding pattern on the substrate 10, the leakage of electricity will be prevented from occurring since the first thin-film transistor and the second thin-film transistor will not be affected by the ambient lights any more.

It could be understood that, the channel doping, the source/drain region doping may be achieved by means of ions implantation.

It could be understood that, in one embodiment, the poly-silicon semiconductor pattern 30 may be formed on the substrate 10.

Figure 2C:
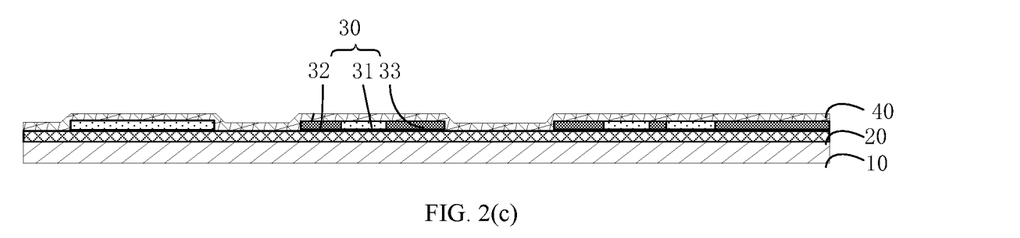

At block S104, referring to FIG. 2(c), a gate insulation layer 40 may be formed.

In this embodiment, the gate insulation layer 40 may be implemented as a silicon oxide layer, or a composite layered structure formed by a silicon nitride layer and a silicon oxide layer.

Figure 2D:
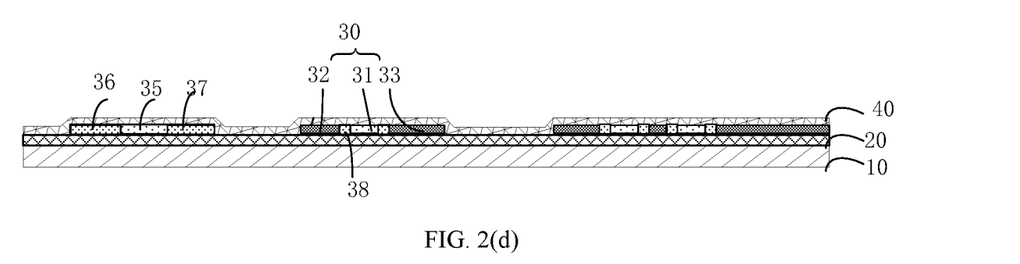

At block S105, referring to FIG. 2(d), the poly-silicon semiconductor pattern 30 is lightly doped, in such a way that a second channel region 35, a second source region 36 and a second drain region 37 may be formed on a second portion of the poly-silicon semiconductor pattern 30 that corresponds to the third thin-film transistor. A lightly doped region 38 may be further formed between the first source region 32 and the first channel region 31 of the first portion of the poly-silicon semiconductor pattern 30 that corresponds to the first thin-film transistor and the second thin-film transistor, or between the first drain region 33 and the first channel region 31 of the first portion of the poly-silicon semiconductor pattern 30 that corresponds to the first thin-film transistor and the second thin-film transistor.

In one embodiment, the lightly doped region 38 is formed by means of ions implantation.

At block S106, an activation treatment is performed.

In this embodiment, a temperature of the activation treatment may be larger than or equal to 500 degrees Centigrade.

It could be understood that, when performing the channel doping, the source/drain region doping and the lightly doping, chemical bonds between atoms of the poly-silicon semiconductor may be broken. By the activation treatment, the broken chemical bonds may be effectively reconnected.

Figure 2E:
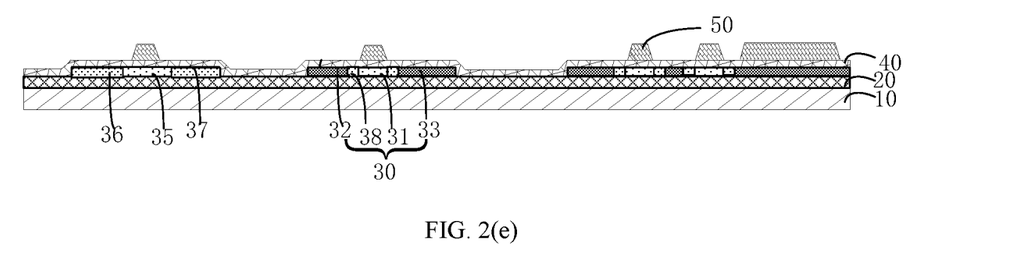

At block S107, referring to FIG. 2(e), after the activation treatment, a gate 50 may be formed on the gate insulation layer 40.

In one embodiment, the gate 50 may be made from a metal material having a melting temperature less than 500 degrees Centigrade. Furthermore, the gate 50 may be made from a metal material having a melting temperature larger than or equal to 400 degrees Centigrade and meanwhile less than 500 degrees Centigrade. For example, the gate may be made from a metal material such as titanium, aluminum, copper, or the like.

It could be understood that, the gate 50 may be separately arranged on the gate insulation layer 40.

Figure 2F:
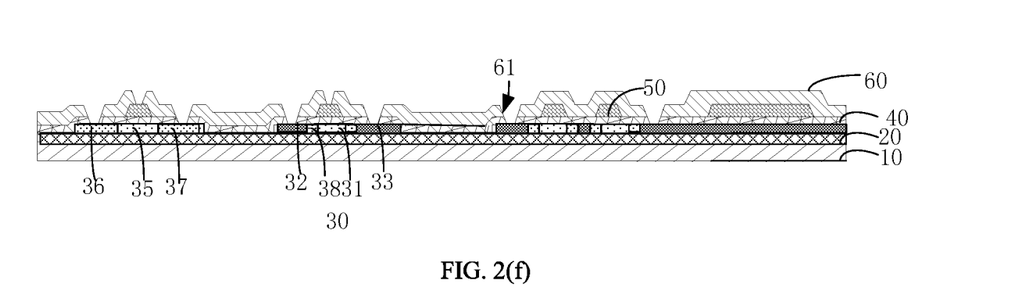

At block S108, referring to FIG. 2(f), an interlayer insulation layer 60 may be formed between the gate insulation layer 40 and the gate 50.

In this embodiment, during the forming process of the interlayer insulation layer 60, a plurality of through holes 61 may be further formed. The plurality of through holes 61 may run through the interlayer insulation layer 60 and the gate insulation layer 40.

In one embodiment, the interlayer insulation layer 60 may be implemented as a silicon nitride layer, a silicon oxide layer, or a composite layered structure formed by a silicon nitride layer and a silicon oxide layer.

At block S109, a hydrogen treatment is performed.

In one embodiment, a temperature of the hydrogen treatment may be larger than or equal to 400 degrees Centigrade and meanwhile less than 500 degrees Centigrade, in such a way that the gate 50 may be made from the metal material having a melting temperature larger than or equal to 400 degrees Centigrade and meanwhile less than 500 degrees Centigrade.

It could be understood that, a grain-boundary state may be present between poly-silicon grains, and an interface state may be present between a poly-silicon grain and an oxide layer, and thus an electrical characteristics of the thin-film transistor may be affected. In this embodiment, dangling bonds or unsaturated bonds between poly-silicon atoms, grain-boundary state, defects of the oxide layer and interface state may be filled with hydrogen atoms in the interlayer insulation layer 60 by the hydrogen treatment, in order to reduce unstable states, enhance mobility and uniformity of threshold voltage.

Figure 2G:
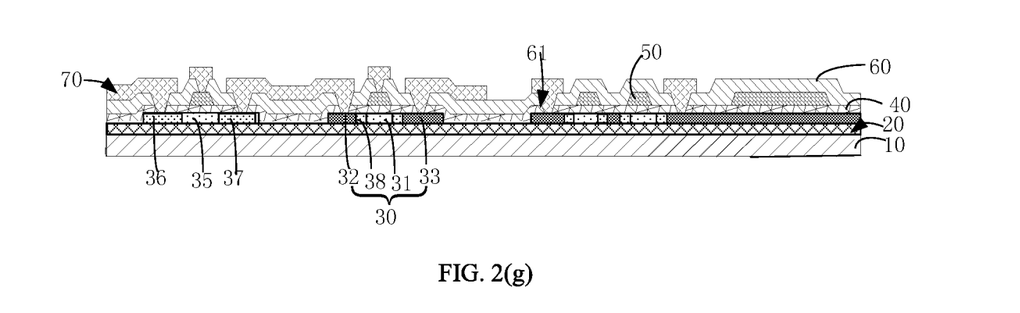

At block S110, referring to FIG. 2(g), after the hydrogen treatment, a source/drain pattern 70 may be formed on the interlayer insulation layer 60, and the source/drain pattern 70 may be respectively connected to the source region and the drain region in the poly-silicon semiconductor pattern 30 via the plurality of through holes 61.

Different from the prior art, in the manufacturing method for the low temperature poly-silicon array substrate 100 provided in the present embodiment, the low temperature poly-silicon array substrate 100 may include a pixel region and a driving region. In this embodiment, the pixel region may include a plurality of pixels arranged in an array, and each of the plurality of pixels may include a corresponding first thin-film transistor and a corresponding pixel electrode. The driving region may include a driving circuit having a CMOS circuit. The CMOS circuit may include a second thin-film transistor and a third thin-film transistor. In this embodiment, the manufacturing method may include: providing a substrate 10; forming a poly-silicon semiconductor pattern 30 on the substrate 10, wherein a first channel region, a first source region and a first drain region may be formed on the first portion of the poly-silicon semiconductor pattern 30 that corresponds to the first thin-film transistor and the second thin-film transistor; forming a gate insulation layer 40; performing an activation treatment; forming a gate 50 on the gate insulation layer 40 after the activation treatment; forming an interlayer insulation layer 60 between the gate insulation layer 40 and the gate 50; performing a hydrogen treatment; forming a source/drain pattern 70 on the interlayer insulation layer 60 after the hydrogen treatment, and connecting the source/drain pattern 70 to the source region and the drain region in the poly-silicon semiconductor pattern 30 via a plurality of through holes 61. In the manufacturing method provided in this embodiment, the gate 50 may be formed on the gate insulation layer 40 after the activation treatment, and then the hydrogen treatment may be performed after the gate is formed. In this way, the activation treatment and the hydrogen treatment are performed separately, and thus the temperature of the hydrogen treatment may be lower than the temperature of the activation treatment, and the activation treatment may be performed before the gate 50 is formed. In the manufacturing method described above, the gate 50 may not only be made from the metal material having a higher melting temperature such as molybdenum or the like, but also from the metal material having a lower melting temperature such as titanium, aluminum, copper, or the like. In this way, the LTPS technology may be applied to the manufacturing method of large-sized screens, and thus it is possible to guarantee the quality of the large-sized screens meanwhile the large-sized screens may possess the advantages of high mobility and low cost.

Figure 3:
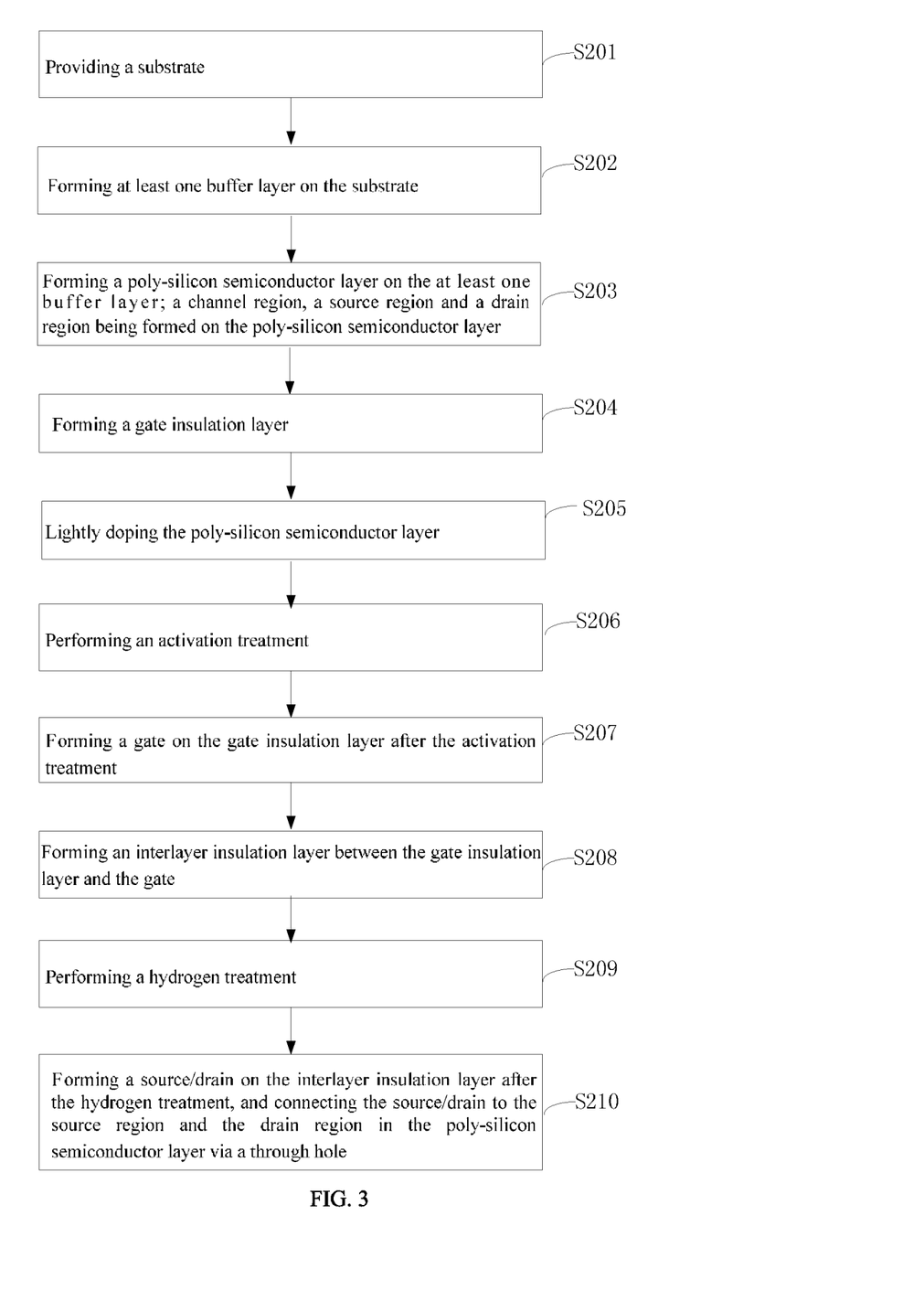
FIG. 3 is a flow chart of a manufacturing method for a low temperature poly-silicon thin-film transistor according to one embodiment of the present disclosure.
Figure 4:
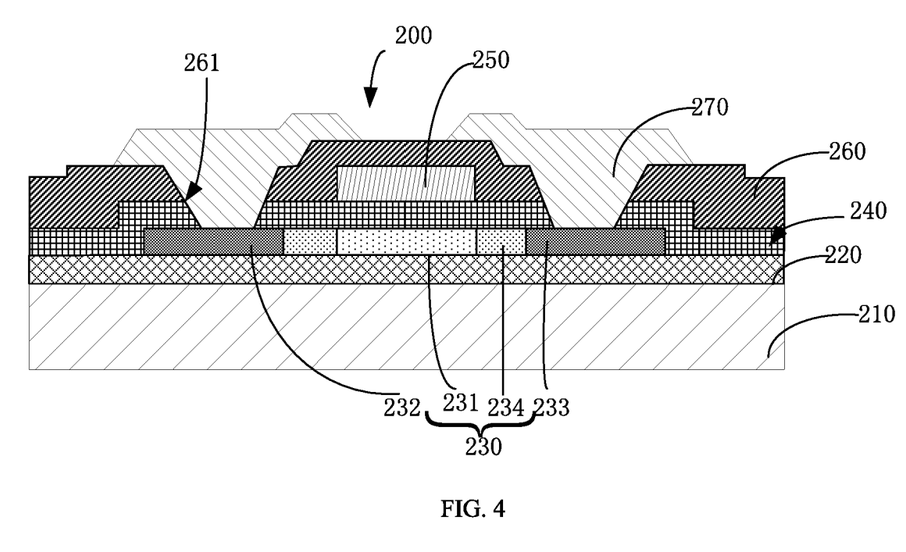
FIG. 4 is a sectional view of the low temperature poly-silicon thin-film transistor manufactured by the manufacturing method shown in FIG. 3.

Referring to FIG. 3 and FIG. 4, a manufacturing method for a low temperature poly-silicon thin-film transistor 200 according to one embodiment of the present disclosure may be further provided. The manufacturing method may include the following blocks.

At block S201, a substrate 210 may be provided.

In one embodiment, the substrate 210 may be a glass substrate.

At block S202, at least one buffer layer 220 may be formed on the substrate 210.

In this embodiment, one buffer layer 220 is formed on the substrate 10.

It could be understood that, the at least one buffer layer 220 may effectively prevent metal ions in the glass substrate, such as aluminum ions, barium ions, sodium ions or the like, from diffusing to an active region during subsequent processes. In addition, the at least one buffer layer 220 may further contribute to reducing heat conduction.

In one embodiment, a light shielding layer may be formed on the substrate 210 before the at least one buffer layer 220 is formed.

In this embodiment, the light shielding layer may be made from a transparent material.

At block S203, a poly-silicon semiconductor layer 230 may be formed on the buffering layer 220. In this embodiment, a channel region 231, a source region 232 and a drain region 233 may be formed on the formed poly-silicon semiconductor layer 230.

In specific, the block S203 may further include following blocks:

forming the poly-silicon semiconductor layer 230;

performing a channel doping in the poly-silicon semiconductor layer 230; and performing a source/drain region doping in the poly-silicon semiconductor layer 230, in such a way that the channel region 231, the source region 232 and the drain region 233 may be formed on the poly-silicon semiconductor layer 230.

It could be understood that, the channel doping, the source/drain region doping may be achieved by means of ions implantation.

It could be understood that, leakage may occur when the poly-silicon semiconductor pattern of the thin-film transistor is exposed to the ambient lights. By arranging the light shielding layer, the leakage will be prevented from occurring since the thin-film transistor will not be affected by the ambient lights any more.

It could be understood that, in one embodiment, the poly-silicon semiconductor layer 230 may be formed on the substrate 210.

At block S204, a gate insulation layer 240 may be formed.

In this embodiment, the gate insulation layer 240 may be implemented as a silicon oxide layer, or a composite layered structure formed by a silicon nitride layer and a silicon oxide layer.

At block S205, the poly-silicon semiconductor layer 230 is lightly doped, in such a way that a lightly doped region 234 may be formed between the source region 232/the drain region 233 and the channel region 231 of the poly-silicon semiconductor layer 230.

At block S206, an activation treatment is performed.

In this embodiment, a temperature of the activation treatment may be larger than or equal to 500 degrees Centigrade.

It could be understood that, during the forming process of the channel region 231, the source region 232 and the drain region 233, that is, when performing the channel doping, source/drain region doping, chemical bonds between atoms of the poly-silicon semiconductor may be broken. By the activation treatment, the broken chemical bonds may be effectively reconnected.

At block S207, after the activation treatment, a gate 250 may be formed on the gate insulation layer 240.

In this embodiment, the gate 250 may be made from a metal material having a melting temperature less than 500 degrees Centigrade. Furthermore, the gate may be made from a metal material having a melting temperature larger than or equal to 400 degrees Centigrade and meanwhile less than 500 degrees Centigrade. For example, the gate may be made from metal materials such as titanium, aluminum, copper, or the like.

At block S208, an interlayer insulation layer 260 may be formed between the gate insulation layer 240 and the gate 250.

In this embodiment, during the forming process of the interlayer insulation layer 260, a through hole 261 may be formed. The through hole 261 may run through the interlayer insulation layer 260 and the gate insulation layer 240.

In one embodiment, the interlayer insulation layer 60 may be implemented as a silicon nitride layer, a silicon oxide layer, or a composite layered structure formed by a silicon nitride layer and a silicon oxide layer.

At block S209, a hydrogen treatment is performed.

In one embodiment, a temperature of the hydrogen treatment may be larger than or equal to 400 degrees Centigrade and meanwhile less than 500 degrees Centigrade, in such a way that the gate 50 may be made from the metal material having a melting temperature larger than or equal to 400 degrees Centigrade and meanwhile less than 500 degrees Centigrade. For example, the gate may be made from a metal material such as titanium, aluminum, copper, or the like.

It could be understood that, a grain-boundary state may be present between poly-silicon grains, and an interface state may be present between a poly-silicon grain and an oxide layer and thus an electrical characteristics of the thin-film transistor may be affected. In this embodiment, dangling bonds or unsaturated bonds between poly-silicon atoms, grain-boundary state, defects of the oxide layers and interface state may be filled with hydrogen atoms in the interlayer insulation layer 60 by the hydrogen treatment, in order to reduce unstable states, enhance mobility and uniformity of threshold voltage.

At block S210, after the hydrogen treatment, a source/drain 270 may be formed on the interlayer insulation layer 260, and the source/drain 270 may be respectively connected to the source region 232 and the drain region 233 in the poly-silicon semiconductor layer 231 via the through hole 261.

Different from the prior art, the manufacturing method for the low temperature poly-silicon thin-film transistor 200 provided in the present embodiment may include: providing a substrate 210; forming a poly-silicon semiconductor layer 230 on the substrate 210, wherein a channel region 231, a source region 232 and a drain region 233 may be formed on the poly-silicon semiconductor layer 230; forming a gate insulation layer 240; performing an activation treatment; forming a gate on the gate insulation layer 240 after the activation treatment; forming an interlayer insulation layer 260 on the gate; performing a hydrogen treatment; forming a source/drain 270 on the interlayer insulation layer 260 after the hydrogen treatment, and connecting the source/drain 270 to the source region 232 and the drain region 233 in the poly-silicon semiconductor layer 230 via the through hole 261. In the manufacturing method provided in this embodiment, the gate may be formed on the gate insulation layer 240 after the activation treatment, and then the hydrogen treatment may be performed after the gate is formed. In this way, the activation treatment and the hydrogen treatment are performed separately, and thus the temperature of the hydrogen treatment may be lower than the temperature of the activation treatment, and the activation treatment may be performed before the gate is formed. In the manufacturing method described above, the gate may not only be made from the metal material having a higher melting temperature such as molybdenum or the like, but also from the metal material having a lower melting temperature such as titanium, aluminum, copper, or the like. In this way, the LTPS technology may be applied to the manufacturing method of large-sized screens, and thus it is possible to guarantee the quality of the large-sized screens meanwhile the large-sized screens may possess the advantages of high mobility and low cost.

The descriptions above are merely the embodiments of the present disclosure, and are not intended to limit the protection scope of the present disclosure. In fact, one skilled in the art may make many equivalents and modifications based on the technical solutions and inventive concept of the present disclosure. All these equivalents and modifications shall all be covered within the protection of the disclosure.

What is claimed is:

1. A method for manufacturing a low temperature poly-silicon array substrate comprising a pixel region comprising a plurality of pixels arranged in an array, and each of the plurality of pixels comprising a first thin-film transistor and a corresponding pixel electrode and a driving region comprising a driving circuit having a CMOS circuit, the CMOS circuit comprising a second thin-film transistor and a third thin-film transistor; the first thin-film transistor and the second thin-film transistor being an n-type thin-film transistor, and the third thin-film transistor being a p-type thin-film transistor; wherein the manufacturing method comprising:
providing a substrate;
forming a poly-silicon semiconductor pattern on the substrate; wherein a first channel region, a first source region and a first drain region are formed on a first portion of the poly-silicon semiconductor pattern that corresponds to the first thin-film transistor and the second thin-film transistor;
forming a gate insulation layer;
performing an activation treatment at a temperature of greater than or equal to 500 degrees Centigrade;
forming a gate from a metal material having a melting temperature less than 500 degrees Centigrade on the gate insulation layer after the activation treatment;
forming an interlayer insulation layer between the gate insulation layer and the gate;
performing a hydrogen treatment at a temperature greater than or equal to 400 degrees Centigrade and less than or equal to 500 degrees Centigrade;
forming a source/drain pattern on the interlayer insulation layer after the hydrogen treatment, and connecting the source/drain pattern to the first source region and the first drain region in the poly-silicon semiconductor pattern via a through hole.

2. The manufacturing method of claim 1, wherein the forming of the poly-silicon semiconductor pattern on the substrate further comprises:
forming the poly-silicon semiconductor pattern;
performing a channel doping in the first portion of the poly-silicon semiconductor pattern that corresponds to the first thin-film transistor and the second thin-film transistor; and
performing a source region/drain region doping in the first portion of the poly-silicon semiconductor pattern that corresponds to the first thin-film transistor and the second thin-film transistor, in such a way that the first channel region, the first source region and the first drain region are formed on the first portion of the poly-silicon semiconductor pattern that corresponds to the first thin-film transistor and the second thin-film transistor.

3. The manufacturing method of claim 2, wherein before forming the gate insulation layer, the manufacturing method further comprises:
lightly doping the poly-silicon semiconductor pattern, in such a way that a second channel region, a second source region and a second drain region are formed on a second portion of the poly-silicon semiconductor pattern that corresponds to the third thin-film transistor, and a lightly doped region is formed between the first source region, the first drain region and the first channel region of the first portion of the poly-silicon semiconductor pattern that corresponds to the first thin-film transistor and the second thin-film transistor.

4. The manufacturing method of claim 1, wherein before forming the poly-silicon semiconductor pattern on the substrate, the manufacturing method further comprises:
forming at least one buffer layer on the substrate.

5. The manufacturing method of claim 4, wherein before forming at least one buffer layer on the substrate, the manufacturing method further comprises:
forming a light shielding pattern on the substrate.

6. A manufacturing method for a low temperature poly-silicon array substrate, the low temperature poly-silicon array substrate comprising a pixel region and a driving region; the pixel region comprising a plurality of pixels arranged in an array, and each of the plurality of pixels comprising a first thin-film transistor and a corresponding pixel electrode; the driving region comprising a driving circuit having a CMOS circuit; the CMOS circuit comprising a second thin-film transistor and a third thin-film transistor; the manufacturing method comprising:
providing a substrate;
forming a poly-silicon semiconductor pattern on the substrate; wherein a first channel region, a first source region and a first drain region being formed on a first portion of the poly-silicon semiconductor pattern that corresponds to the first thin-film transistor and the second thin-film transistor;
forming a gate insulation layer;
performing an activation treatment at a first temperature;
forming a gate from a metal material having a melting point less than the first temperature on the gate insulation layer after the activation treatment;
forming an interlayer insulation layer between the gate insulation layer and the gate;
performing a hydrogen treatment at a temperature below the melting point of the metal material;

forming a source/drain pattern on the interlayer insulation layer after the hydrogen treatment, and connecting the source/drain pattern to the first source region and the first drain region in the poly-silicon semiconductor pattern via a through hole.

7. The manufacturing method of claim 6, wherein the forming the poly-silicon semiconductor pattern on the substrate further comprises:
   forming the poly-silicon semiconductor pattern;
   performing a channel doping in the first portion of the poly-silicon semiconductor pattern that corresponds to the first thin-film transistor and the second thin-film transistor; and
   performing a source region/drain region doping the first portion of the poly-silicon semiconductor pattern that corresponds to the first thin-film transistor and the second thin-film transistor, in such a way that the first channel region, the first source region and the first drain region are formed on the first portion of the poly-silicon semiconductor pattern that corresponds to the first thin-film transistor and the second thin-film transistor.

8. The manufacturing method of claim 7, wherein before forming the gate insulation layer, the manufacturing method further comprises:
   lightly doping the poly-silicon semiconductor pattern, in such a way that a second channel region, a second source region and a second drain region are formed on a second portion of the poly-silicon semiconductor pattern that corresponds to the third thin-film transistor, and a lightly doped region is formed between the first source region, the first drain region and the first channel region of the first portion of the poly-silicon semiconductor pattern that corresponds to the first thin-film transistor and the second thin-film transistor.

9. The manufacturing method of claim 6, wherein the temperature of the activation treatment is greater than or equal to 500 degrees Centigrade, the temperature of the hydrogen treatment is greater than or equal to 400 degrees Centigrade and the metal material has a melting temperature greater than 400 degrees Centigrade and less than 500 degrees Centigrade.

10. The manufacturing method of claim 6, wherein the first thin-film transistor and the second thin-film transistor are an n-type thin-film transistor, while the third thin-film transistor is a p-type thin-film transistor.

11. The manufacturing method of claim 6, wherein before forming the poly-silicon semiconductor pattern on the substrate, the manufacturing method further comprises:
   forming at least one buffer layer on the substrate.

12. The manufacturing method of claim 11, wherein before forming at least one buffer layer on the substrate, the manufacturing method further comprises:
   forming a light shielding pattern on the substrate.

13. A manufacturing method for a low temperature poly-silicon thin-film transistor, comprising:
   providing a substrate;
   forming a poly-silicon semiconductor layer on the substrate; a channel region, a source region and a drain region being formed on the poly-silicon semiconductor layer;
   forming a gate insulation layer;
   performing an activation treatment at a first temperature;
   forming a gate from a metal material having a melting point less than the first temperature on the gate insulation layer after the activation treatment;
   forming an interlayer insulation layer between the gate insulation layer and the gate;
   performing a hydrogen treatment at a temperature below the melting point of the metal material;
   forming a source/drain on the interlayer insulation layer after the hydrogen treatment, and connecting the source/drain to the source region and the drain region in the poly-silicon semiconductor layer via a through hole.

14. The manufacturing method of claim 13, wherein a temperature of the activation treatment is greater than or equal to 500 degrees Centigrade; wherein a temperature of the hydrogen treatment is greater than or equal to 400 degrees Centigrade and the metal material has a melting temperature greater than 400 degrees Centigrade and less than 500 degrees Centigrade.

15. The manufacturing method of claim 13, wherein the forming the poly-silicon semiconductor layer on the substrate further comprises:
   forming the poly-silicon semiconductor layer;
   performing a channel doping in the poly-silicon semiconductor layer; and
   performing a source region/drain region doping in the poly-silicon semiconductor layer, in such a way that the channel region, the source region and the drain region are formed on the poly-silicon semiconductor layer.

16. The manufacturing method of claim 15, wherein before forming the gate insulation layer, the manufacturing method further comprises:
   lightly doping the poly-silicon semiconductor layer, in such a way that a lightly doped region is formed between the source region, the drain region and the channel region of the poly-silicon semiconductor layer.

17. The manufacturing method of claim 15, wherein before forming the poly-silicon semiconductor pattern on the substrate, the manufacturing method further comprises:
   forming at least one buffer layer on the substrate.

18. The manufacturing method of claim 17, wherein before forming at least one buffer layer on the substrate, the manufacturing method further comprises:
   forming a light shielding layer on the substrate.

* * * * *